United States Patent [19]
Suzuki et al.

[11] Patent Number: 5,404,360
[45] Date of Patent: Apr. 4, 1995

[54] SIMULATOR FOR SIMULATING CIRCUIT OPERATION

[75] Inventors: Tsuneki Suzuki; Norio Yoshida, both of Hyogo, Japan

[73] Assignee: Mitsubishi Denki Kabushiki Kaisha, Tokyo, Japan

[21] Appl. No.: 846,954

[22] Filed: Mar. 6, 1992

[30] Foreign Application Priority Data

Aug. 30, 1991 [JP] Japan ............................... 3-219460

[51] Int. Cl.6 .............................................. G06F 11/00
[52] U.S. Cl. ...................................... 371/23; 395/575; 371/61
[58] Field of Search .......................... 371/61, 23, 62; 364/578, 488; 395/575

[56] References Cited

U.S. PATENT DOCUMENTS

| | | | |
|---|---|---|---|
| 4,970,664 | 11/1990 | Kaiser et al. | 364/521 |
| 5,095,454 | 3/1992 | Huang | 364/578 |
| 5,105,374 | 4/1992 | Yoshida | 364/578 |

FOREIGN PATENT DOCUMENTS 2-252066 10/1990 Japan .

OTHER PUBLICATIONS

T. Okabe, et al., "A Mixed Level Simulator With Enhanced Timing Verification Capability", Oct. 8, 1990, pp. 53–60, (with English abstract).

*Primary Examiner*—Robert W. Beausoliel, Jr.
*Assistant Examiner*—Ly V. Hua
*Attorney, Agent, or Firm*—Oblon, Spivak, McClelland, Maier, & Neustadt

[57] ABSTRACT

A simulator for simulating operations of a logical circuit has as its object the provision of a simulator capable of detailed timing error checking without impairing the simulation executing speed. A timing check primitive adding circuit, based on circuit information indicating electronic devices and loop circuits selected for timing error checking, outputs circuit information with simulation control data for controlling the simulation of only the selected devices or selected loop circuits. A timing error detection circuit and a timing error cause analyzing circuit grasp changes in test pattern input and output signals of a selected device and perform detailed timing error checking.

2 Claims, 7 Drawing Sheets

SIMULATOR FOR SIMULATING CIRCUIT OPERATION

BACKGROUND OF THE INVENTION

1. Field of the Invention

The present invention relates to a simulator for checking the timing errors of the devices in a simulated circuit while simulating the devices of the simulated circuit.

2. Description of the Prior Art

In the design of logical circuits, logical simulators are frequently used as checking means of logical operations and timing of the devices therein. There are also simulators exclusively used for the checking of timing.

FIG. 1 is a flow chart showing timing check operations in a conventional simulator. The operations of the simulator will be described below with reference to the flow chart.

First, in step S1, a process of inputting an input test pattern signal to an input terminal of a simulated circuit is simulatively executed in the simulator. The simulator executes the simulation of the simulated circuit by calculating the output value corresponding to the input value of each device. Then, in step S2, the simulator checks the timing error in the input and output signals of each device of the simulated circuit on the basis of the results of the simulation obtained in the step S1.

When it is decided in step S3 that a timing error has occurred, the simulator moves to step S4. In the step S4, the simulator outputs an error message list, inclusive of the kind of the timing error, the time when the error occurred, the name of the device on which the error occurred, etc., serving as a reference for making clear the cause of the timing error. On the other hand, when it is decided in the step S3 that no timing error has occurred, the simulator advances directly to step S5.

The simulator, in the step S5, checks whether or not all the devices within the simulated circuit have gone through the simulation, and if there is any device which has not gone through the simulation, it returns to the step S1. The steps S1–S5 are repeated until all of the devices have been subjected to the simulation. Thus, the timing check is performed by the simulator.

Conventional simulators have performed the timing error check of all of the devices as objects of timing error check and output the timing error messages as described above.

Generally speaking, a high simulating speed is required of the simulator, and therefore, the period of time required for the timing check must be limited to a minimum so as not to impair the operating speed. Accordingly, there has been a problem with conventional simulators in that they are only able to check the timing error as to limited check items and unable to perform detailed timing error checking.

SUMMARY OF THE INVENTION

The present invention has been made to solve the above described problem. Accordingly, it is an object of the present invention to provide a simulator capable of achieving detailed timing error checking without hindering the simulating operations.

The simulator according to the present invention checks timing errors of devices within a simulated circuit while performing a simulation of operations of the simulated circuit and comprises storage means having a storage area assigned to each device of the simulated circuit, recognition means of devices subjected to timing check accepting selected device information in which devices which are desired to be subjected to timing check are specified as selected devices for recognizing devices corresponding to the selected devices within the simulated circuit as devices to be subjected to timing check, simulation executing means for supplying a plurality of input terminals of the simulation circuit with a test pattern signal for each thereof and performing simulation of operations of each of the devices of the simulated circuit according to the test pattern signal, information table making means for writing into the storage area corresponding to the device in a format of information table, every time a change in level occurs in the output signal of each device of the simulated circuit, at least level change information specifying the substance of the change in level and cause-of-level-change information indicating the input terminal of the plurality of input terminals through which the pattern signal causing the level change was input, timing error detection means for detecting a timing error of input and output signals taking only the devices to be subjected to timing check recognized by said recognition means as the objects while the simulation is being carried out, and timing error cause analyzing means for providing, upon detection of a timing error by the timing error detection means, at least information specifying the substance of the timing error and information specifying error causing pattern indicative of the test pattern signal of the plurality of test pattern signals which caused the timing error, on the basis of the information table for the device, in which the error was detected, of the simulated circuit.

The timing error detection means according to the present invention, while a simulation is carried out, detects the timing error of the input and output signals for only the devices as the objects of timing check within the simulated circuit that are recognized by the recognition means of devices as the objects of timing check, and therefore, the number of the devices actually subjected to the timing error check can be limited to a minimum essentially required.

DETAILED DESCRIPTION OF THE PREFERRED EMBODIMENTS

Figure 1:
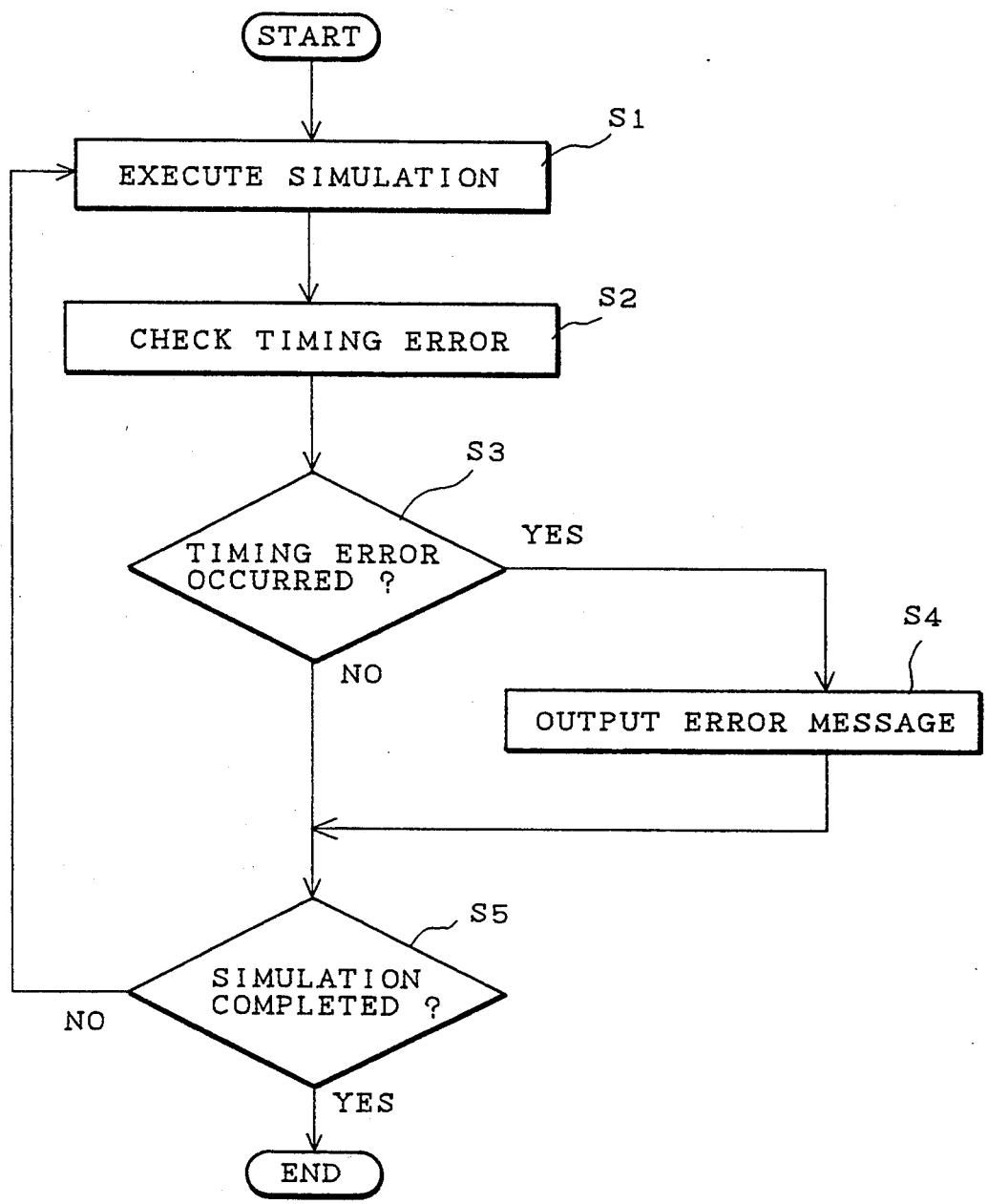
FIG. 1 is a flow chart showing timing checking operations in a conventional simulator.
Figure 2:
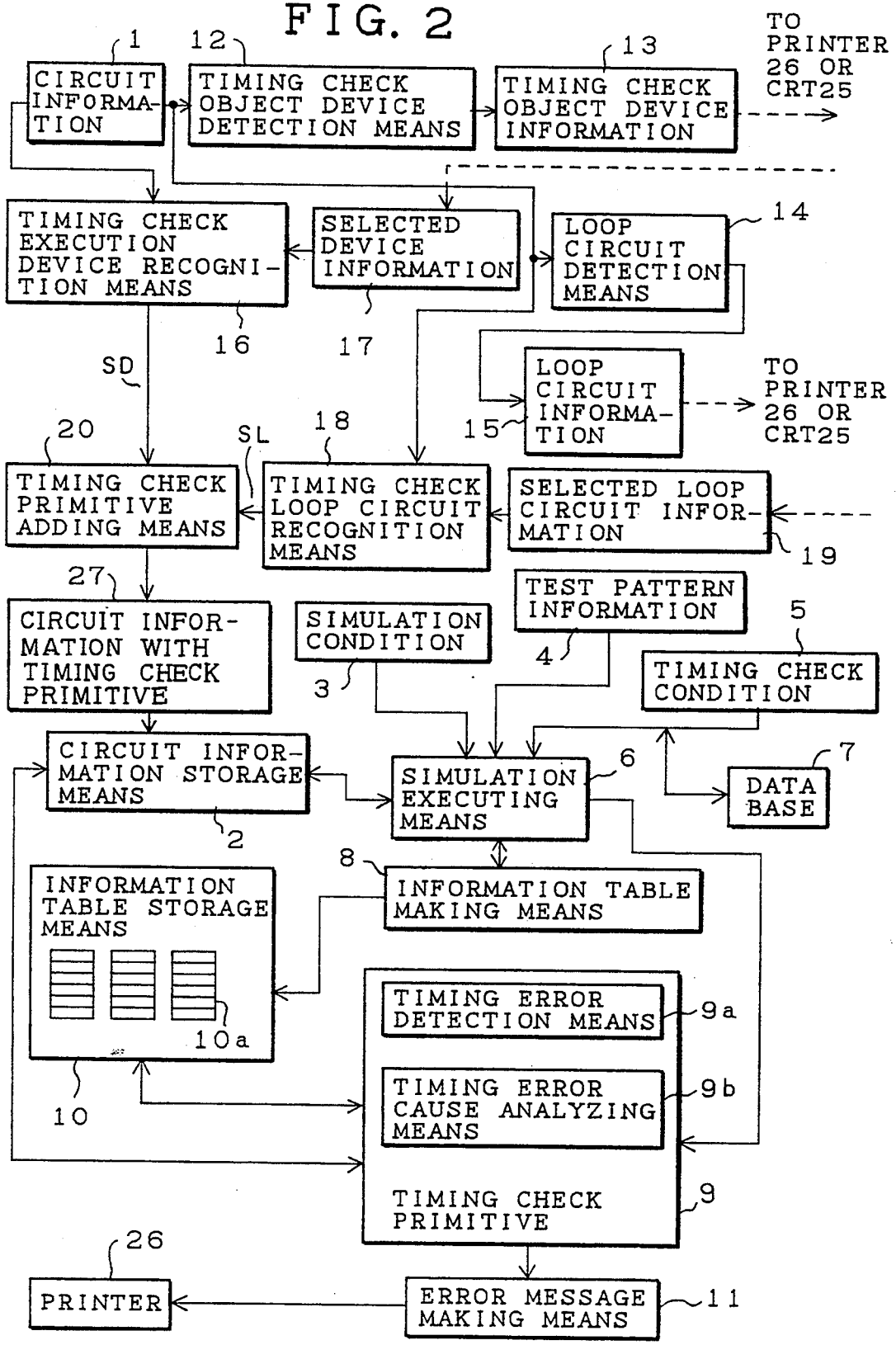
FIG. 2 is a block diagram showing a structure of a simulator according to an embodiment of the present invention.

FIG. 2 is a block diagram showing a functional structure of a simulator as an embodiment of the present invention.

Figure 3:
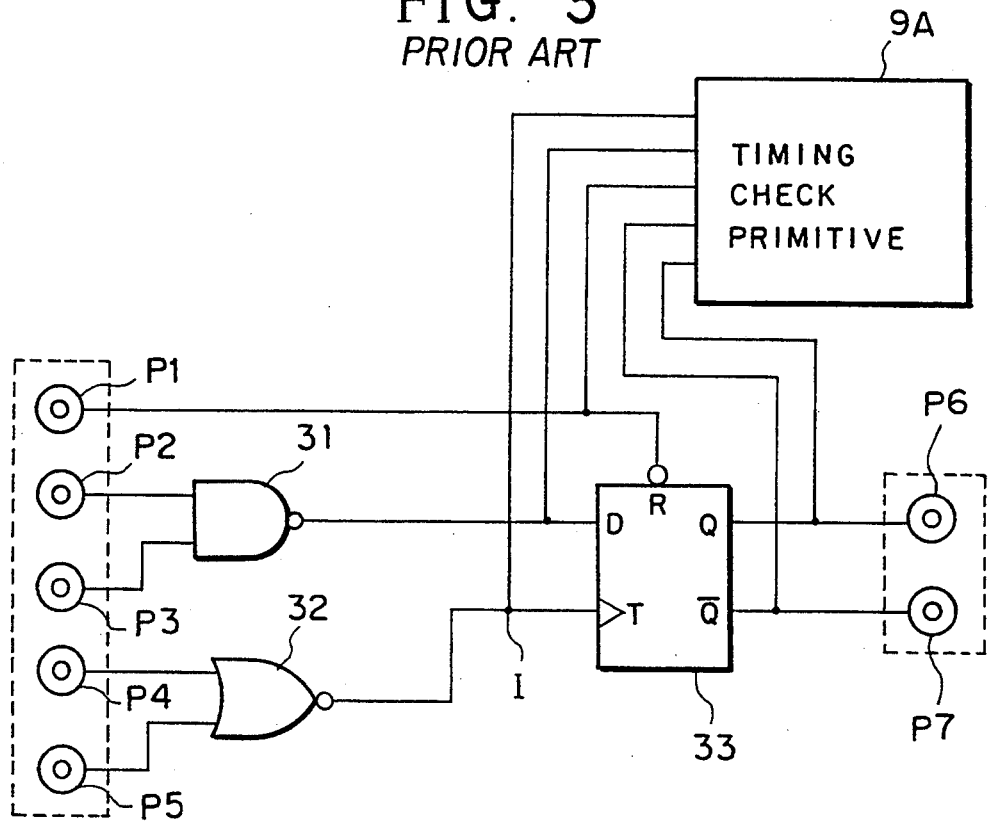
FIG. 3 is a circuit diagram showing an example of a simulated circuit together with an established timing check primitive for a device.

As shown in FIG. 2, circuit information 1 describing interconnections of devices within a simulated circuit is supplied to detection means 12 of devices as objects of timing check, loop circuit detection means 14, recognition means 16 of devices desired to be subjected to timing check, and recognition means 18 of loop circuits desired to be subjected to timing check. An example of the simulated circuit is shown in FIG. 3, which circuit has a NAND gate 31, a NOR gate 32, and a D flip-flop 33. Reference characters P1-P5 denote test pattern input terminals and P6 and P7 denote output terminals. The detection means of devices as objects of timing check 12 and the loop circuit detection means 14 together will be called object detection means and the recognition means of devices desired to be subjected to timing check 16 and the recognition means of loop circuits desired to be subjected to timing check 18 together will be called recognition means.

The detection means of devices as objects of timing check 12 extracts all devices as possible objects of timing error check (for example all flip-flops, all counters, and all memory devices) from the circuit information 1 as devices as objects of timing check and outputs information of devices as objects of timing check 13 showing such devices as objects from a printer 26 or the like. On the other hand, the loop circuit detection means 14 extracts all loop circuits from the circuit information 1 and outputs loop circuit information 15 showing such loop circuits as objects from the printer 26 or the like.

Further, selected device information circuit 17, in which devices selected as those desired to be subjected to timing error check by the operator out of the devices as objects of timing check are specified, is supplied to the recognition means of devices desired to be subjected to timing check 16, and selected loop circuit information 19, in which loop circuits selected as those desired to be subjected to timing error check by the operator out of the devices as objects of timing check are specified, is supplied to the recognition means of loop circuits desired to be subjected to timing check 18.

The recognition means of devices desired to be subjected to timing check 16 recognizes the selected devices within the simulated circuit as the devices as actual objects of timing error check on the basis of the circuit information 1 and the selected device information 17 and outputs circuit information with selected device information SD to a timing check primitive adding means 20. On the other hand, the recognition means of loop circuits desired to be subjected to timing check 18 recognizes the selected loop circuits within the simulated circuit as the loop circuits as actual objects of timing error check on the basis of the circuit information 1 and the selected loop circuit information 19 and outputs circuit information with selected loop circuit information SL to the timing check primitive adding means 20.

Figure 4:
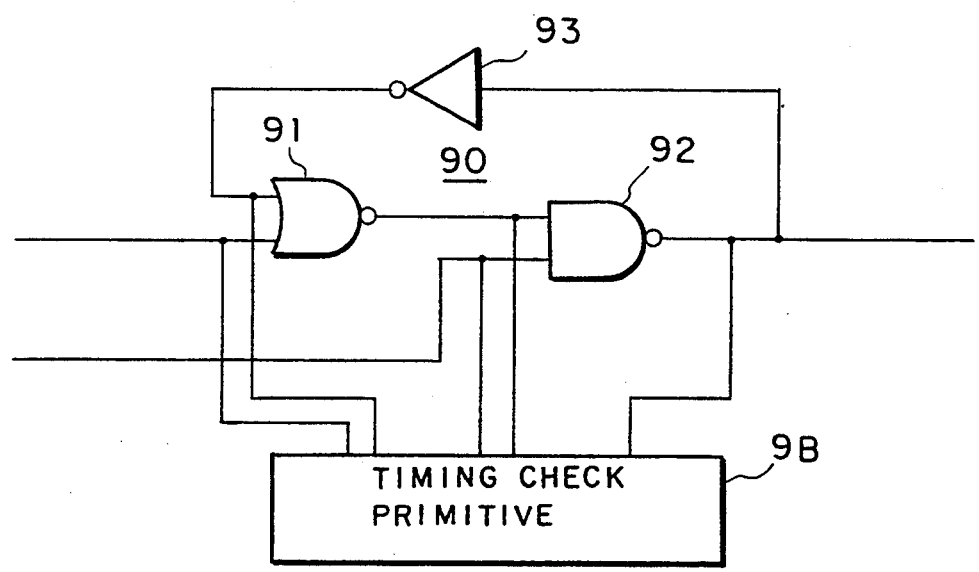
FIG. 4 is a circuit diagram showing another example of a simulated circuit together with an established timing check primitive for a loop circuit.

The timing check primitive adding means 20, on the basis of the circuit information with selected device information SD and the circuit information with selected loop circuit information SL, outputs circuit information with timing check primitive 27, in which a timing check primitive device 9A as shown in FIG. 3 is added between the input and output of the selected device and, at the same time, a timing check primitive loop circuit 9B as shown in FIG. 4 is added between the input and output of the selected device. Referring to FIG. 4, the loop circuit is made up of a NOR gate 91, a NAND gate 92, and an inverter 93, and therein, the timing check primitive loop circuit 9B is connected with the input portion of the NOR gate 91 and the input and output portions of the NAND gate 92. The circuit information with timing check primitive 27 is written into circuit information storage means 2. In FIG. 2, there is shown a timing check primitive 9 representative of the timing check primitive device 9A and timing check primitive loop circuit 9B.

Further, information of simulation condition 3 specifying sections etc. of the simulated circuit becoming objects of simulation, test pattern information 4 of the input signals supplied to the input terminals of the simulated circuit, and information of timing check condition 5 serving as reference for timing error checking of the input and output signals of the device and loop circuit are supplied to simulation executing means 6. Fundamental conditions of timing check are supplied from a data base 7 to the simulation executing means 6.

The status of execution of the simulation by the simulation executing means 6 is constantly supplied to the information table making means 8 and the timing check primitive 9 (each of the timing check primitive device 9A and the timing check primitive loop circuit 9B), and the information table making means 8 writes later described information into an information table 10a provided within information table storage means 10 every time a change in level is produced in the output signal of each device upon occurrence of an event in each device of the simulated circuit.

The area for storing the information table 10a is provided with by the information table making means 8 in the information table storage means 10, corresponding to each device of the simulated circuit. The items of the information written into the information table 10a are the output value of the device when the signal is changed upon occurrence of an event in each device and its time, terminal information as to which input terminal of the simulated circuit was supplied with the test pattern which caused the change in the output, and the signal value of the test pattern causing the error and its time.

Timing error detection means 9a within the timing check primitive device 9A grasps, on the basis of the status of execution of the simulation by the simulation executing means 6, the changes in the input and output signals of the device brought about by signal changes in the signal lines between devices and checks a timing error on the basis of the information of timing check condition 5.

In the timing error checking device, the timing error checking of the following check items can be performed:

Set up error check
Hold error check
Error check of pulse width to input pin
Spike error check
Hazard error check
Race error check The reason why such a large number of check items of timing error checking device can be set up is that the timing check primitive device 9A is provided only for one or plural devices that are recognized as selected devices out of the devices as objects of timing check and, hence, the devices to which the timing check primitive device 9A is attached are limited in number. Namely, it is because the simulation executing speed of the simulation executing means 6 is not impaired even if detailed timing error checking is carried out in one timing check primitive device 9A.

On the other hand, the timing error detecting means 9a within the timing check primitive loop circuit 9B grasps, on the basis of the status of execution of the simulation by the simulation executing means 6, the changes in the input and output signals of the loop circuit brought about by signal changes in the signal lines between loop circuits and checks a timing error on the basis of the information of timing check condition 5.

In the timing error checking loop circuit, the timing error checking of the following check items can be performed:

Oscillation check
Spike check
Hazard check
Race check

The reason why such a large number of check items of timing error checking for loop circuit can be set up is that the timing check primitive loop circuit 9B is provided only for one or plural loop circuits that are recognized as selected loop circuits out of all the loop circuits and, hence, the loop circuits to which the timing check primitive loop circuit 9B is attached are limited in number. Namely, it is because the simulation executing speed of the simulation executing means 6 is not impaired even if detailed timing error check is carried out in one timing check primitive loop circuit 9B.

The timing check for the spike check, hazard check, and race check is the checking of a signal entering the circuit portion in question from another circuit portion. The oscillation check is a check to determine such an event that, in a circuit loop including devices outputting a inverted value of the input value (NAND gate, NOR gate, etc.) being odd in number, all the devices within the loop are brought to an active state to be an error. Timing error cause analyzing means 9b, when the timing error checking means 9a detects a timing error, traces back its cause on the basis of the information table 10a given to the device and outputs the obtained results to error message making means 11 as the later described error message.

Figure 5:
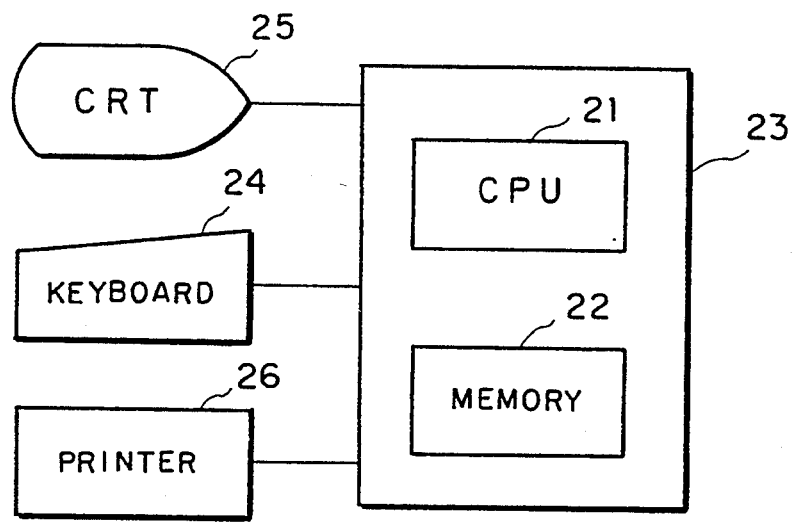
FIG. 5 is a block diagram showing a hardware structure of the simulator shown in FIG. 2.

FIG. 5 is a block diagram showing a hardware structure of a simulator as an embodiment of the present invention. As shown in FIG. 5, the simulator comprises a computer 23 incorporating a CPU 21, a memory 22, etc., a keyboard 24 as information inputting means to the computer 23, a CRT 25 and a printer 26 as information outputting means from the computer 23.

Namely, all the means (except storage means) shown in FIG. 2 are realized by programs executed by the CPU 21 and each storage means is formed within the memory 22. All of the information is input and output through the memory 22.

Figure 7:
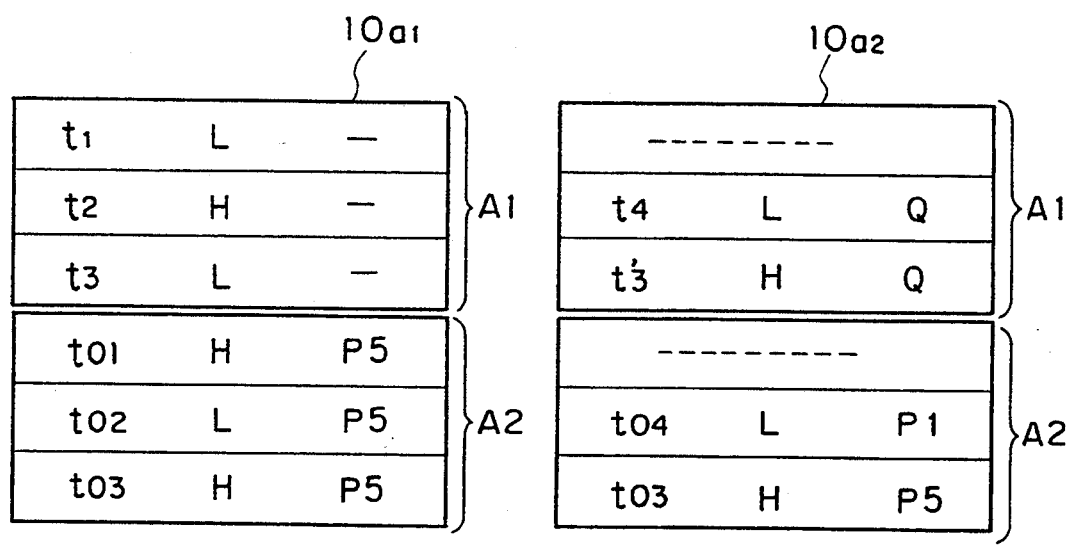
FIG. 7 is an explanatory diagram showing a status of an information table related with the NOR gate and flip-flop shown in FIG. 3.
Figure 6:
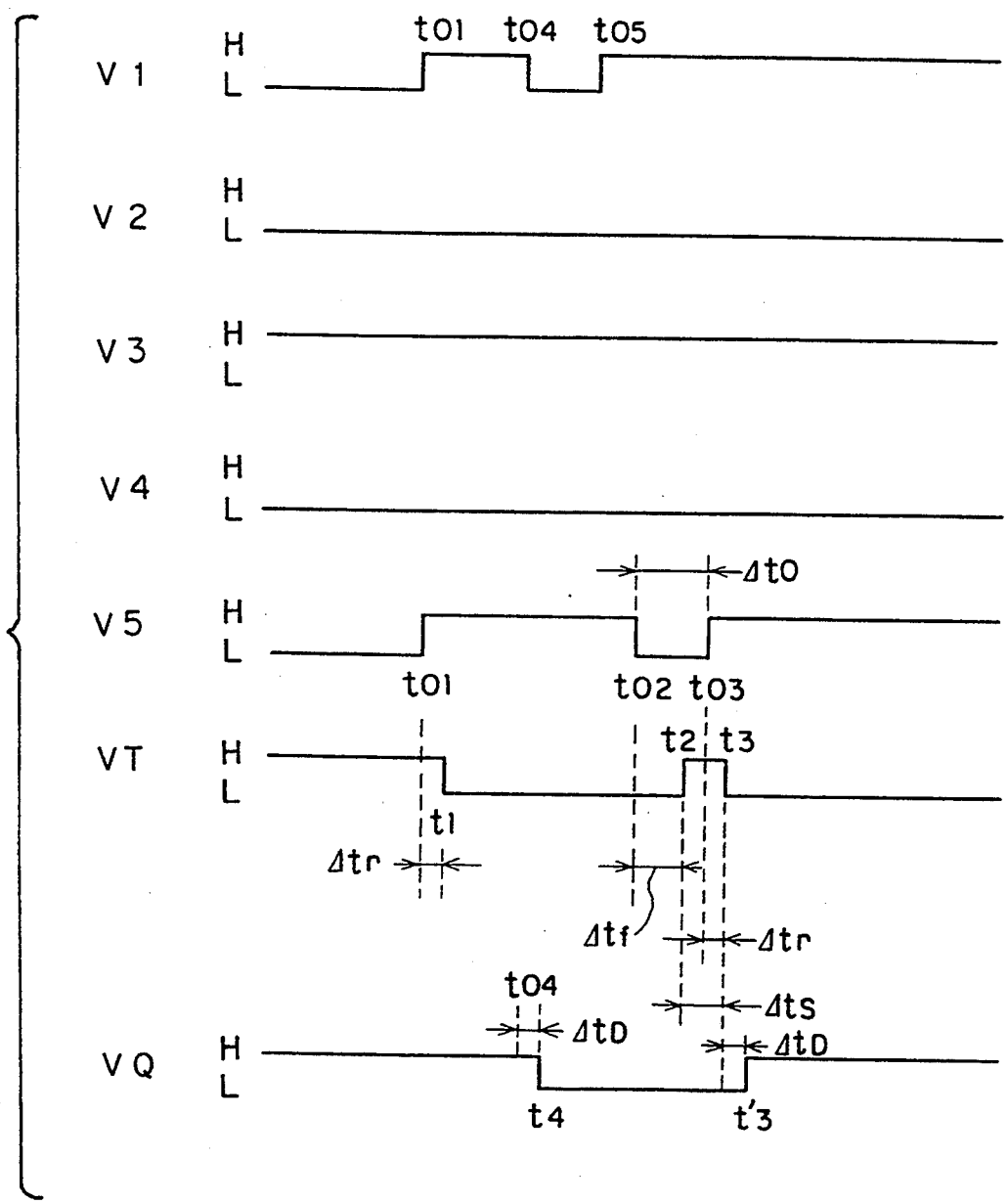
FIG. 6 is a timing chart showing signal changes in the circuit shown in FIG. 3.

Now, the operation of the simulator will be described taking, as an example, the case where test pattern signals V1–V5 shown in FIG. 6 are respectively applied to input terminals P1–P5 of the simulated circuit shown in FIG. 3. An information table 10a1 for the NOR gate 32 and an information table 10a2 for the flip-flop 33 are shown in FIG. 7 and a flow of operations of the simulator is shown in FIG. 8.

Figure 8:
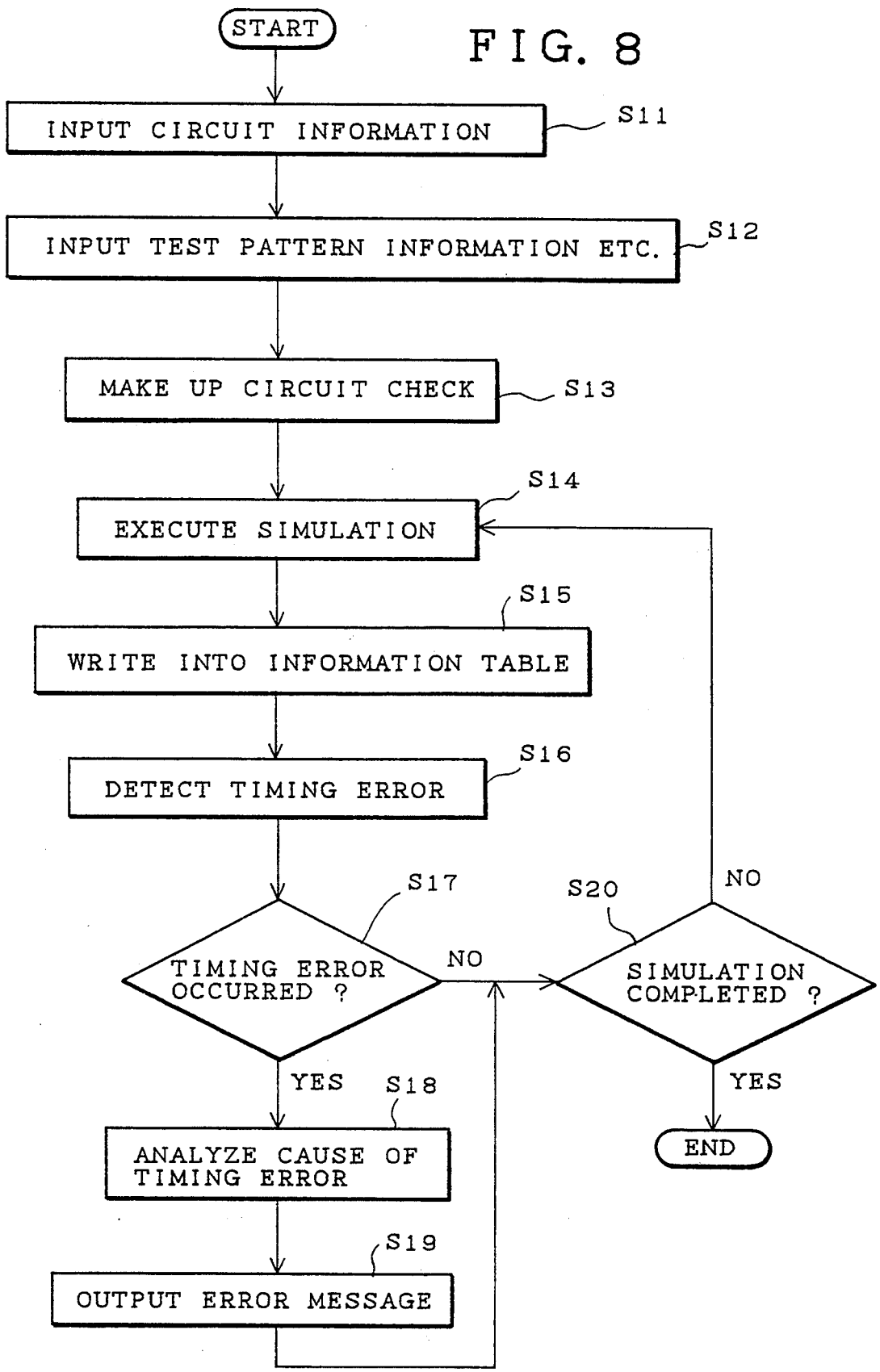
FIG. 8 is a flow chart showing timing checking operations in a simulator.

First, in step S11 of FIG. 8, information as to connections of devices in the simulated circuit of FIG. 3 is input as circuit information 1. In step S12, information such as the test pattern signals V1–V5 is input from input means such as the keyboard 24 as information of simulation condition 3, test pattern information 4, and information of timing check condition 5. The sets of information 3–5 are acquired by the simulation executing means 6. Then, in step S13, a process for making up the circuit information with timing check primitive 27 is performed. Details of the processing will be described below.

First, the detection means of devices as objects of timing check 12 extracts from the circuit information 1 all of the devices as possible objects of timing error check as the devices as the objects of timing check, and outputs such information as information of devices as objects of timing check 13 to the CRT 25 or printer 26. In the present case, the device as the object of timing check is only the flip-flop 33. On the other hand, the loop circuit detection means 14 extracts all of the loop circuits from the circuit information 1 and outputs the information as loop circuit information 15. However, when the circuit information 1 for the circuit of FIG. 3 is input, there is no loop circuit in the circuit of FIG. 3 and, hence, the loop circuit information 15 is not output.

The operator of the simulation selects devices required to be subjected to timing error check according to the information of devices as objects of timing check 13 output as described above and makes out selected device information 17, in which such devices are specified as selected devices. In this case, the devices as objects of timing check shown in the information of devices as objects of timing check 13 is only the flip-flop 33. Hence, the operator determines whether or not the flip-flop 33 should be taken up as the selected device. We suppose that the flip-flop 33 is determined as the selected device. Accordingly the selected devices information 17 indicates the flip-flop 33. Further, the operator, when loop circuit information 15 is output, refers to it and makes out selected loop circuit information 19 in which loop circuits required to be subjected to timing error check are specified as selected loop circuits. The selected device information 17 is supplied to the recognition means of devices desired to be subjected to timing check 16 and the selected loop circuit information 19, if any, is supplied to the recognition means of loop circuits desired to be subjected to timing check 18.

The recognition means of devices desired to be subjected to timing check 16, on the basis of the circuit information 1 and the selected device information 17, recognizes the devices corresponding to the selected devices within the simulated circuit as the devices desired to be subjected to timing error check and outputs the circuit information with selected device information SD to the timing check primitive adding means 20. On the other hand, the recognition means of loop circuit desired to be subjected to timing check 18, on the basis of the circuit information 1 and the selected loop circuit information 19, if it is output, recognizes the loop circuits corresponding to the selected loop circuits within the simulated circuit as the loop circuits desired to be subjected to timing error check and outputs the circuit information with selected loop circuit information SL to the timing check primitive adding means 20.

The timing check primitive adding means 20, based on the circuit information with selected device information SD and the circuit information with selected loop circuit SL, outputs the circuit information with timing check primitive 27 in which the timing check primitive device 9A is attached between the input and output of the selected device and the timing check primitive loop circuit 9B, if there is the circuit information SL, is attached between the input and output of the selected loop circuit. In the present case, the circuit information 27 indicates that the timing check primitive device 9A is attached to the flip-flop 33. The information table making means 8 allocates storage areas within the information table storage means 10 to the devices 31-33 included in the simulated circuit.

Below will be described the operation of the simulator checking the flip-flop 33 as the desired object of timing error check while making a simulation of the operation of the simulated circuit. The simulation executing means 6, upon being activated in step 14, starts a simulation of the logic operation of the simulated circuit. More specifically, it supplies the test pattern signals V1-V5 of FIG. 6 to the input terminals P1-P5 respectively, and performs the simulation of operations of the devices 31-33. During the course of this simulation, the information table making means 8 writes new data into the information table 10a every time new event occurs with the devices 31-33.

In preparation for describing the information table 10a, the timing chart of FIG. 6 will be described. The test pattern signals V4 and V5 of FIG. 6 are supplied to the NOR gate 32 of FIG. 3. When V4="L" as shown in FIG. 6, the delayed inverted value of the signal V5 appears as the signal VT at the output of the device 32.

We now consider such a case that the delay time $\Delta t_r$ corresponding to the rise of the input signal to the NOR gate 32 is longer than the delay time $\Delta t_f$ corresponding to the fall of the input signal. Then, the pulse width $\Delta t_0$ in the test pattern signal V5 becomes the pulse width $\Delta t_s$ in the signal VT at the position of the node I in FIG. 3, and when this pulse width $\Delta t_s$ is smaller than the threshold value $\Delta t_{th}$ (for example 0.6 ns) required as a normal T input of the flip-flop 33, this pulse becomes a spike.

Incidentally, the changes in level of the test pattern signal V1 at the points of time $t_{01}$, $t_{04}$, and $t_{05}$, as they are, become the changes in level at the reset input of the flip-flop 33. Further, since V2="L" and V3="H" the output of the NAND gate 31 is "H" at all times.

On the other hand, the output signal VQ of the Q output of the flip-flop 33 falls to "L" level at the point of time $t_4$, which is the time $\Delta t_D$ delayed from the point of time $t_{04}$ when the signal V1 as the reset signal becomes active ("L" level). Then, the output signal VQ rises to "H" level at the point of time $t_3'$ which is the time $\Delta t_D$ delayed from the point of time $t_3$ when the signal VT as the T input is recognized to have risen from "L" to "H" level. (Although, in an actual circuit, the level at the point of time $t_3$ is not recognized as "H" level because the "H" level pulse of the signal VT generated during the period $t_2-t_3$ is a spike, it is recognized as such by the simulator in order to keep up the simulation.) In the following description of the information table 10a, the state in the table at the point of time $t_3$ is taken up as an example. In FIG. 7, there are shown two information tables 10a1 and 10a2. One information table 10a1 is corresponding to the NOR gate 32 and the other information table is corresponding to the flip-flop 33.

As shown in FIG. 7, each of the information tables 10a1 and 10a2 is formed of a first subtable A1 and a second subtable A2. Though not shown, the information table of the NAND gate 31 is formed similarly. Each line of the first subtable A1 includes the point of time at which a change in level occurred in the output signal from the corresponding device ($t_4$, $t_3'$ in the case of the table 10a2), distinction as to the level ("H" or "L"), and identification information at which terminal of the device the change in level occurred (in the case of the table 10a2, "Q output terminal").

The second subtable A2 includes the information indicating which test pattern signal of those supplied to the input terminals P1-P5 caused the change in level in the corresponding line of the first subtable. More specifically, each line thereof includes the terminal number (one of P1-P5) indicating the input terminal, the time information ($T_{04}$, $t_{03}$) showing at what time the change in level of the test pattern causing the change in level on the side of the device occurred, and the change in level ("H" or "L") of the test pattern signal at that time.

The information of each line of the second subtable A2 is adapted to be transferred from the information table of the device disposed in the preceding stage of the device under consideration every time a change in level is produced in the output signal of the device. Each of the subtables A1 and A2 has a storage capacity at least for three lines (i.e., for three times of events or more). In the illustrated example, there is stored information for latest three events of the device. When a new event occurs, the oldest information in each of the subtables A1 and A2 is erased and updated with the information corresponding to the new event.

While the simulation of the circuit operations is performed as described above, error checking of the device and the loop circuit as the desired objects of the timing error check is executed. Namely, in the next step S16, the timing error detection as described above is performed by the timing error detection means 9a. The timing error detection means 9a exists in the timing check primitive 9 provided only between the input and output of the device or the loop circuit specified by the selected device information 17 or the selected loop circuit information 19. In the present case, it exists in the timing check primitive provided only for the flip-flop 33.

The timing error detection means 9a makes the timing error check through comparison of the information of timing check condition 5 and the simulation results in the information table. Here, we consider the case where the spike of the signal VT during the period $t_2-t_3$ in FIG. 6 is detected. Then, the timing error detection means 9a compares the simulation results in the information table and the information of timing check condition 5 and thereby recognizes that a timing error has occurred in the flip-flop 33 at the point of time $t_3$. At this time, the decision in step S17 becomes "YES", and in the following step S18, the timing error cause analyzing means 9b is activated and thereby the cause of the error is analyzed.

In concrete terms, the timing error cause analyzing means 9b first refers to the latest information in the information table 10a2 of the device 33 where the timing error occurred. It is found then that the error at the point of time $t_3$ is related with the change in level at the point of time $t=t_{03}$ of the test pattern signal V5 input to the input terminal P5. Accordingly, it is known that the cause of the error is present in the test pattern signal V5 or in the device within the circuit portion from the input terminal P5 to the flip-flop 33 (the NOR gate 32 in the illustrated case).

Then, the timing error cause analyzing means 9b analyzes the operating status of the devices existing in the circuit portion from the erring device 33 to the terminal P5 by referring to the information table 10a for each device. In the illustrated case, it is known that the error was caused by the difference in the delay of the rise and the delay of the fall in the NOR gate 32. If the NOR gate 32 has nothing to cause such error, then the cause must be in the test pattern signal V5 supplied to the input terminal P5.

Although there are shown only three devices 31–33 in the example of FIG. 3, an actual simulated circuit has much greater numbers of devices. Therefore, it is not always possible that the device caused the error is directly specified only by the above described operation. However, it can be attained at least to narrow down the range of the objects of analysis of the cause by finding out to which input terminal the test pattern signal related with the error was supplied.

Figure 9:
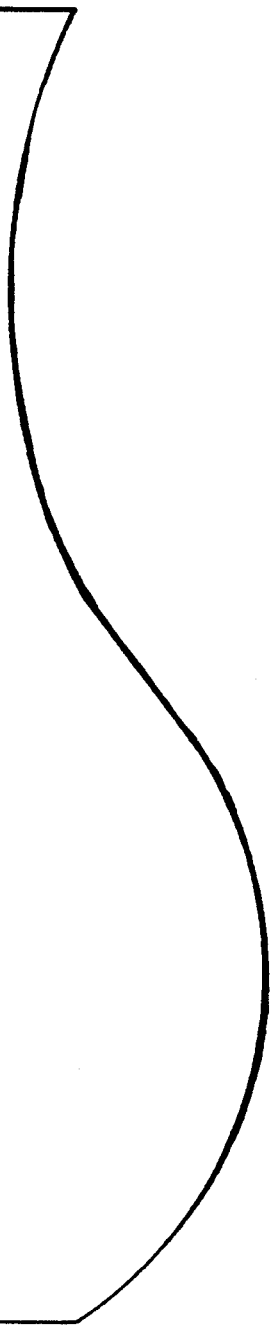
FIG. 9 is an explanatory diagram showing an example of error message list.

Following the above described analysis, the error message making means 11 is activated in step S19 of FIG. 8, whereby an error message list, part of which is illustrated in FIG. 9, is output from the printer 26. This error message includes, as information for specifying the substance of the timing error:

(1) the device number of the erring device,
(2) the point of time at which the error occurred, and
(3) the kind of the error.

Further, the following items are listed up as information connected with the cause of the error:

(4) the input terminal number related with the error;
(5) the point of time at which the change in level causing the error was produced at the input terminal related with the error, and
(6) the error causing device number when the device whereby the error was caused is specified.

Therefore, the operator, by reading the error messages, can find out the cause of the timing error in the simulated circuit quite easily. No meaningless error messages are output because the error messages are output only for the devices and loop circuits which were desired to be subjected to timing error check by the operator out of all of the devices as possible objects of the timing check and all loop circuits.

The operations in FIG. 8 are performed until the scheduled simulation is completed and, upon completion of the simulation, the routine is ended through the step S20.

Although, in the above described embodiment, the item (4)–item (6) are listed up as the information related with the cause of error, the range of the objects of investigation to clear up the cause of error can be considerably narrowed down, as compared with the conventional simulators, if there is included at least the information of the item (4), i.e., the information specifying the test pattern, which is related with the error, out of a plurality of input test patterns. Therefore, while it is preferred that all of the item (4)–item (6) are included in the error messages, it may be well if there is included only the item (4).

Although, the above described embodiment was that in which a timing check primitive 9 was provided for a flip-flop, it may be provided for a latch, a counter, a memory device, or the like. Even in such case, similar effects can be obtained. By the use of the information table 10a, it also becomes possible, when a change is produced at the output terminal P6 or P7 by an input signal, to identify through which input terminal the input signal was input and, further, to obtain the delay in the path reaching the output terminal P6 or P7.

Although, in the above described embodiment, timing error checking for devices were explained in detail, timing error checking for loop circuits can also be explained in the same way. Also when timing error checking is performed for loop circuits, the timing check primitives can be set up only for the loop circuits which are desired to be subjected to the error check and, hence, the number of the loop circuits actually subjected to the check can be limited to a minimum.

According to the present invention as described above, the timing error detection means, while a simulation is performed, detects the timing error of the input and output signals for only the devices that are recognized by the recognition means of devices desired to be subjected to timing check within the simulated circuit, and therefore, the number of the devices actually subjected to the timing error check can be limited to a minimum essentially required.

As a result, the timing error check can be performed in detail without hindering the operations for executing simulation.

What is claimed is:

1. A circuit simulator for detecting timing errors of electronic devices and loop circuits of an object circuit while simulating an operation of said object circuit, wherein at least one of said electronic devices and loop circuits is a delay element, said circuit simulator comprising:

information table storage means having a storage area assigned to each of said electronic devices and loop circuits;

object detection means, connected to said object circuit, for identifying all electronic devices and loop circuits of said object circuit as possible candidates for timing error checking upon ascertaining object circuit information relating to the presence of electronic devices and loop circuits and interconnections therebetween;

recognition means for receiving selected device information from a user indicating which of said electronic devices are to be checked for timing errors and selected loop circuit information from said user indicating which of said loop circuits are to be checked for timing errors and acknowledging a presence of the corresponding electronic devices and loop circuits of said object circuit by outputting signals indicating a presence of said electronic devices and said loop circuits selected by said user;

timing check primitive adding means, connected to receive said signals indicating which of said electronic devices and loop circuits of said object circuit are to be checked for timing errors output from said recognition means, for generating simulation control data which controls simulation of each of said electronic devices and loop circuits acknowledged by said recognition means;

simulation executing means, connected to said object circuit, for supplying a plurality of test pattern input terminals provided on said object circuit with a plurality of test pattern input signals to thereby simulate an operation of each of said electronic devices and said loop circuits acknowledged by said recognition means, and for outputting signals indicating level transitions on test pattern output terminals of said object circuit;

information table recording means, connected to receive said signals output from said simulation executing means indicating that a level transition has occurred on a test pattern output terminal provided on said object circuit during simulation of one of said electronic devices or loop circuits, for writing information to a storage area of said information table storage means assigned to the electronic device or loop circuit on whose output said level transition appears, wherein said information includes at least a first component representing a substance of said level transition and a second component identifying a test pattern input terminal of said object circuit to which a test pattern input signal causing said level transition is applied;

timing error detection means, connected to said simulation executing means, for detecting timing errors on respective test pattern input terminals and output terminals of said object circuit and outputting timing error signals;

timing error cause analyzing means, connected to receive said timing error signals output by said timing error detection means, for providing information specifying at least a substance of a detected timing error and an input test pattern signal which has produced said timing error, in accordance with the contents of a storage area of said information table storage means to which the electronic device or loop circuit exhibiting said timing error is assigned; and timing error message means, connected to receive said information specifying at least a substance of a detected timing error and an input test pattern signal which has produced said timing error output from said timing error cause analyzing means, for outputting a timing error message including information representing a substance of said timing error and a test pattern input signal which produced said timing error.

2. A circuit simulator for detecting timing errors of electronic devices of an object circuit while simulating an operation of said object circuit, wherein at least one of said electronic devices is a delay element, said circuit simulator comprising:

information table storage means having a storage area assigned to each of said electronic devices;

object detection means, connected to said object circuit, for identifying all electronic devices of said object circuit as possible candidates for timing error checking upon ascertaining object circuit information relating to the presence of electronic devices and interconnections therebetween;

recognition means for receiving selected device information from a user indicating which of said electronic devices are to be checked for timing errors and acknowledging a presence of the corresponding electronic devices of said object circuit by outputting signals indicating a presence of said electronic devices selected by said user;

timing check primitive adding means connected to receive said signals indicating which electronic devices of said object circuit are to be checked for timing errors output from said recognition means, for generating simulation control data which controls simulation of each of said electronic devices acknowledged by said recognition means;

simulation executing means, connected to said object circuit, for supplying a plurality of test pattern input terminals provided on said object circuit with a plurality of test pattern input signals to thereby simulate an operation of each of said electronic devices acknowledged by said recognition means, and for outputting signals indicating level transitions on test pattern output terminals of said object circuit;

information table recording means, connected to receive said signals output from said simulation executing means indicating that a level transition has occurred on a test pattern output terminal provided on said object circuit during simulation of one of said electronic devices, for writing information to a storage area of said information table storage means assigned to the electronic device on whose output said level transition appears, wherein said information includes at least a first component representing a substance of said level transition and a second component identifying a test pattern input terminal of said object circuit to which a test pattern input signal causing said level transition is applied;

timing error detection means, connected to said simulation executing means, for detecting timing errors on respective test pattern input terminals and output terminals of said object circuit and outputting timing error signals;

timing error cause analyzing means, connected to receive said timing error signals output by said timing error detection means, for providing information specifying at least a substance of a detected timing error and an input test pattern signal which has produced said timing error, in accordance with the contents of a storage area of said information table storage means to which the electronic device exhibiting said timing error is assigned; and timing error message means, connected to receive said information specifying at least a substance of a detected timing error and an input test pattern which has produced said timing error output from said timing error cause analyzing means, for outputting a timing error message including information representing a substance of said timing error and a test pattern input signal which produced said timing error.

* * * * *